(12) United States Patent
Kim et al.

(10) Patent No.: US 7,259,098 B2
(45) Date of Patent: Aug. 21, 2007

(54) METHODS FOR FABRICATING SEMICONDUCTOR DEVICES

(75) Inventors: Seok Su Kim, Gyeonggi-do (KR); Chee Hong Choi, Busan (KR)

(73) Assignee: Dongbu Electronics Co., Ltd., Seoul (KR)

( * ) Notice: Subject to any disclaimer, the term of this patent is extended or adjusted under 35 U.S.C. 154(b) by 295 days.

(21) Appl. No.: 10/747,599

(22) Filed: Dec. 29, 2003

(65) Prior Publication Data

US 2004/0142569 A1 Jul. 22, 2004

(30) Foreign Application Priority Data

Dec. 31, 2002 (KR) .................. 10-2002-0087898

(51) Int. Cl.
*H01L 21/302* (2006.01)
(52) U.S. Cl. .............. 438/696; 438/257; 438/266; 438/289; 438/296; 438/593; 438/595; 438/596
(58) Field of Classification Search ............. 438/257, 438/266, 289, 296, 593, 595, 596, 696
See application file for complete search history.

(56) References Cited

U.S. PATENT DOCUMENTS 5,674,768 A   10/1997   Chang et al. ............... 437/43
6,969,655 B2 *  11/2005   Kim .......................... 438/267

* cited by examiner

*Primary Examiner*—George A. Goudreau
(74) *Attorney, Agent, or Firm*—Saliwanchik, Lloyd & Saliwanchik

(57) ABSTRACT

Semiconductor devices and methods for fabricating a semiconductor devices are disclosed. A disclosed method comprises: forming a first gate electrode functioning as a flash memory; forming first spacers on sidewalls of the first gate electrode; forming a second gate electrode functioning as a normal gate electrode; forming a source/drain region with a shallow junction by performing a first ion implantation process using at least one of the first spacers as a mask; forming second spacers on a sidewall of the first spacer and on sidewalls of the second gate electrode; forming a source/drain region with a deep junction by performing a second ion implantation process using the second spacers as a mask.

3 Claims, 3 Drawing Sheets

METHODS FOR FABRICATING SEMICONDUCTOR DEVICES

FIELD OF THE DISCLOSURE

The present disclosure relates to methods for fabricating semiconductor devices and, more particularly, to methods of fabricating a McRAM device, having a first gate electrode functioning as a flash memory and a second gate electrode functioning as a normal gate electrode, wherein the first and second gate electrodes are formed on a single cell.

BACKGROUND

In view of the rapid spread of intelligent devices such as computers, semiconductor devices are being rapidly developed. Semiconductor devices are now being required to have high storage-capacity and to operate at high speed. To meet these requirements, technologies for manufacturing semiconductor devices are being developed with an eye toward improving the degree of integration, the reliability, and the response rate of the semiconductor devices.

Generally, semiconductor memory devices are divided into volatile and nonvolatile memory devices. Examples of nonvolatile memory devices include a flash memory device, a McRAM device, etc. The McRAM device includes a first gate electrode functioning as a flash memory and a second gate electrode functioning as a normal gate electrode in a single cell. The McRAM device has recently been in the spotlight due to its advantages (e.g., low power dissipation, low manufacturing cost, and rapid speed of information processing).

Unfortunately, conventional fabrication methods are not able to form an LDD (lightly drained drain) region when fabricating such a McRAM device. Therefore, the McRAM device has not been used to cope with the recent trend that requires semiconductor devices capable of operating at low voltage.

DETAILED DESCRIPTION

Figure 1:
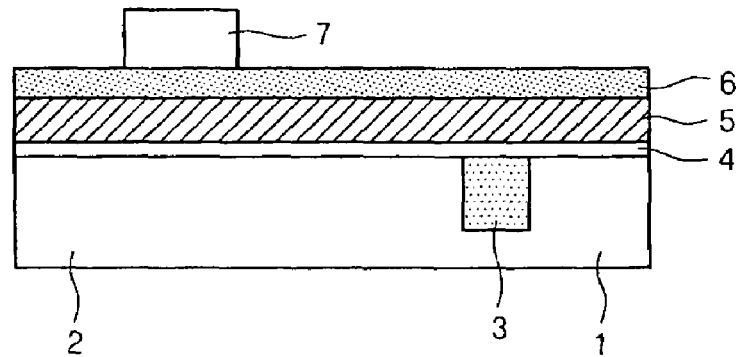
FIGS. 1 through 6 are cross-sectional views of an example semiconductor device during an example fabricating process performed in accordance with the teachings of the present disclosure.

Referring to FIG. 1, a substrate 1 including an active region 2 and a non-active region 3 is provided. A device isolation layer is formed in the non-active region 3. The device isolation layer is preferably a trench structure. Alternatively, the device isolation layer may be a field oxide layer formed by a local oxidation of silicon (LOCOS) process.

Next, a dielectric layer 4, a first conducting layer 5, and a first insulating layer 6 are sequentially deposited on the substrate 1. The first conducting layer 5 is preferably formed of polysilicon. The first insulating layer 6 is preferably formed of oxide or nitride. A first mask layer 7 is formed on the first insulating layer 6. The first mask layer 7 is preferably a photoresist pattern formed by photolithography.

Figure 2:
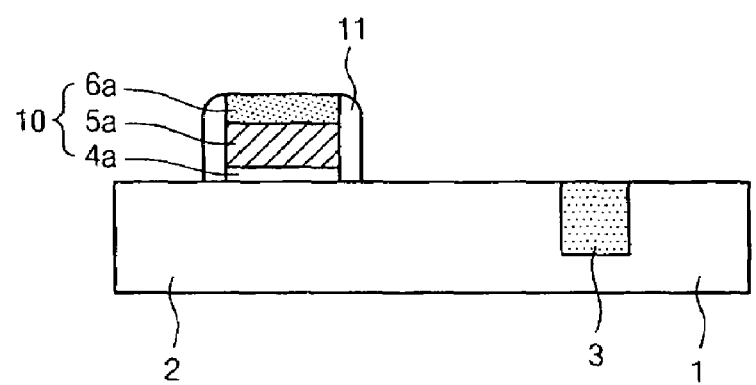

Referring to FIG. 2, an etching process is performed using the first mask layer 7 as an etching mask to form a dielectric layer pattern 4a, a first conducting layer pattern 5a, and a first insulating layer pattern 6a. As a result, a first gate electrode 10 comprising the dielectric layer pattern 4a, the first conducting layer pattern 5a, and the first insulating layer pattern 6a is formed in the active region 2 of the substrate 1. The first gate electrode 10 functions as a flash memory.

Next, an insulating layer is deposited over the substrate 1 and the first gate electrode 10. The insulating layer may be a single layer formed of nitride or oxide. Alternatively, the insulating layer may be a multi-layer comprising nitride and oxide. An etch back process is performed on the insulating layer to form spacers. As a result, first spacers 11 are formed on the sidewalls of the first gate electrode 10.

Figure 3:
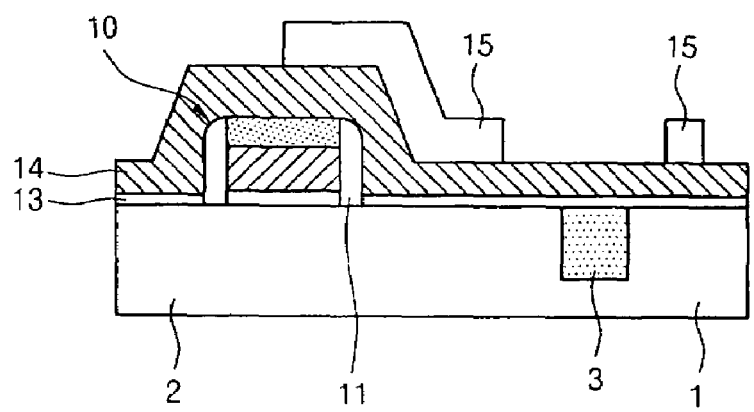

Referring to FIG. 3, an oxide layer 13 is deposited on the surface of the substrate 1. A second conducting layer 14 is deposited over the oxide layer 13, the first spacers 11, and the first gate electrode 10. The second conducting layer 14 is preferably polysilicon. A second mask layer 15 is formed on the second conducting layer 14. The second mask layer 15 is preferably a photoresist pattern formed by photolithography.

Figure 4:
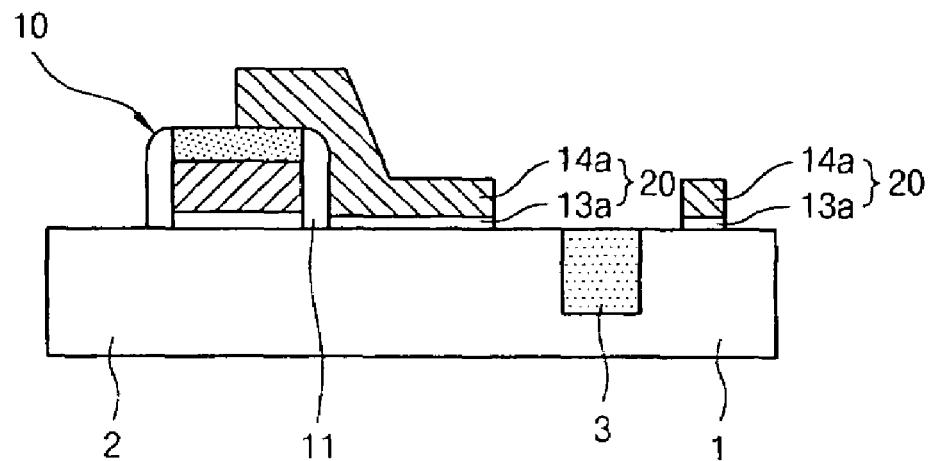

Referring to FIG. 4, an etching process is performed using the second mask layer 15 as an etching mask to form a second conducting layer pattern 14a and a gate oxide pattern 13a. As a result, a second gate electrode 20 comprising the second conducting layer pattern 14a and the gate oxide pattern 13a is formed on the substrate 1. The second gate electrode 20 functions as a normal gate electrode. Also as a result of this etching process, one of the first spacers 11 is exposed as shown in FIG. 4.

Figure 5:
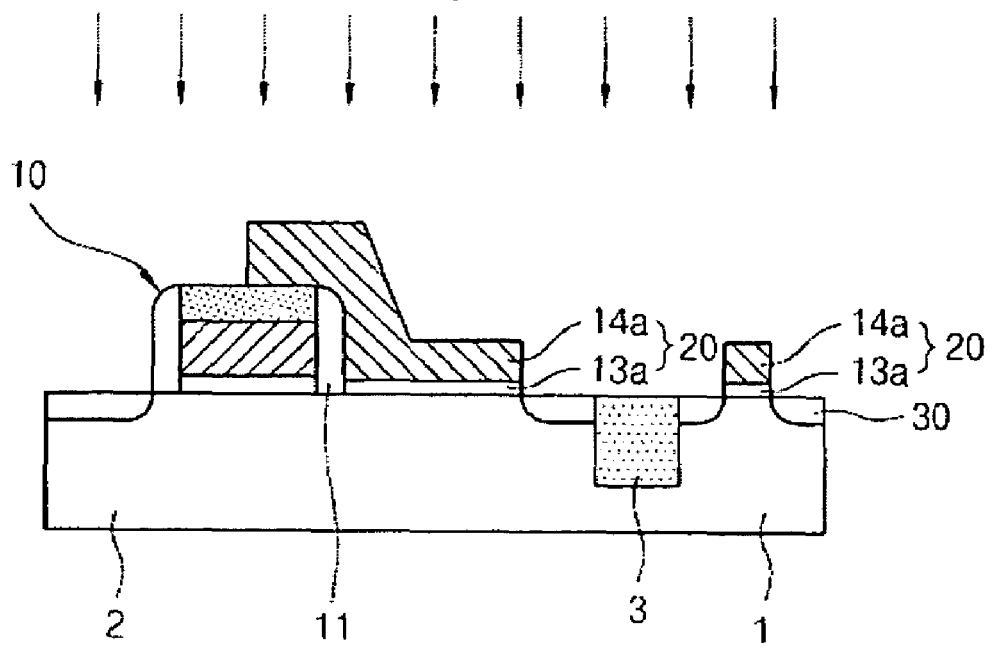

Referring to FIG. 5, a first ion implantation process is performed using the first spacer 11 exposed through the formation of the second gate electrode 20 as a mask. As a result, a source/drain region 30 with a shallow junction is formed adjacent to the first gate electrode 10 and the second gate electrode 20 in the upper part of the substrate 1.

Figure 6:
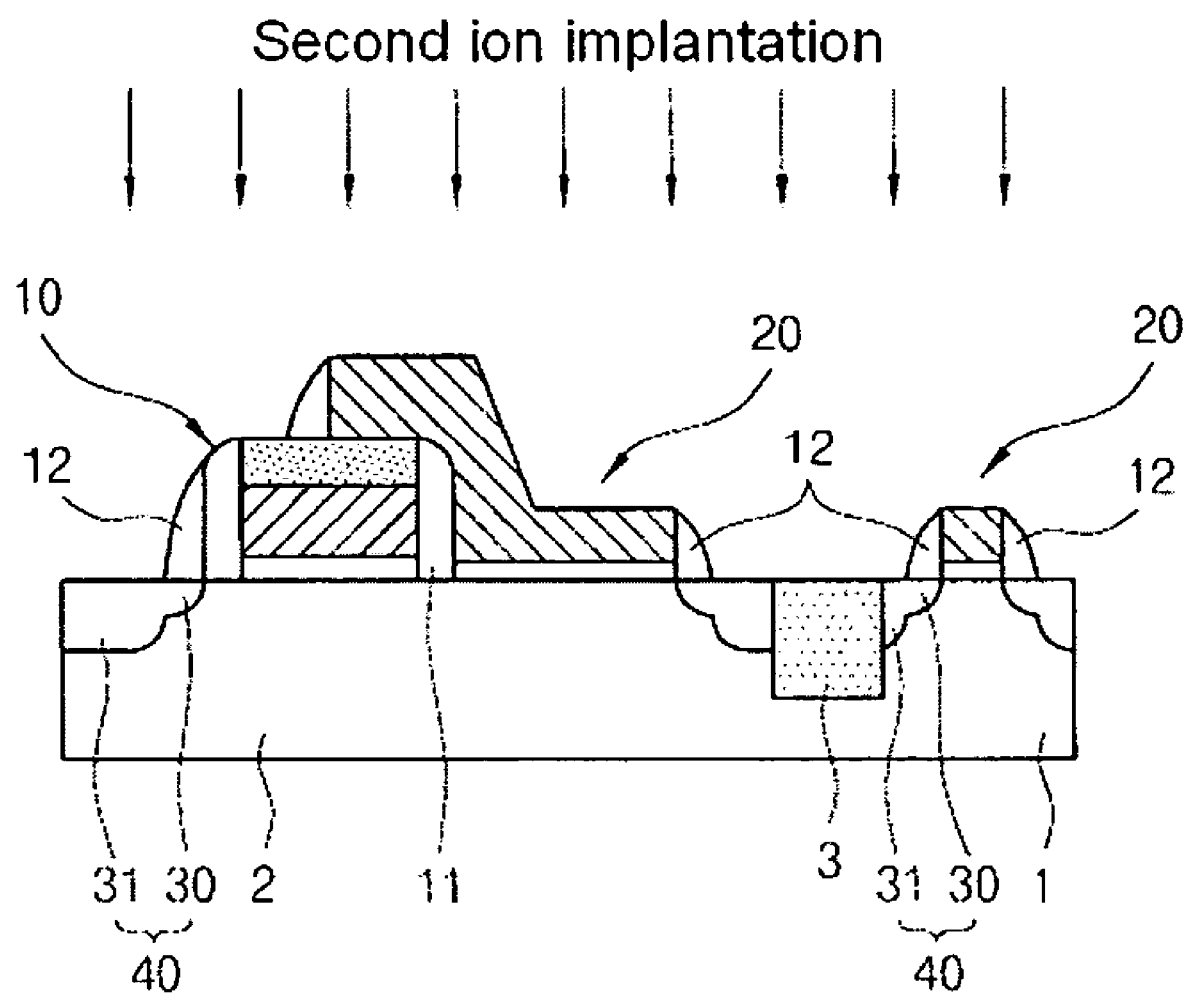

Referring to FIG. 6, an insulating layer is formed on the resulting structure. An etch back process is then performed on the insulating layer. As a result, second spacers 12 are formed on a sidewall of the first exposed spacer 11 and the sidewalls of the second gate electrode 20. The insulating layer is a single layer formed of oxide or nitride. Alternatively, the insulating layer is a multi-layer comprising oxide and nitride.

A second ion implantation process is then performed using the second spacers 12 as a mask to form source/drain regions 31 having deep junctions in the substrate 1. As a result, source/drain regions 40 with an LDD region is formed in the substrate 1. Such a source/drain region with an LDD region comprises a source/drain region 30 with a shallow junction and a source/drain region 31 with a deep junction.

Accordingly, methods of fabricating semiconductor devices such as a McRAM device have been provided which include: a first gate electrode functioning as a flash memory, a second gate electrode functioning as a normal gate electrode, and a source/drain region with an LDD region. The illustrated methods are appropriately applicable to the fabrication of semiconductor devices capable of operating even at low voltage.

From the foregoing, persons of ordinary skill in the art will appreciate that the above disclosed methods form a source/drain region with an LDD region in fabricating a semiconductor device such as a McRAM device. As a result, semiconductor devices such as McRAM devices having a source/drain region with an LDD region have been provided.

An example method disclosed herein for fabricating a semiconductor device comprises: providing a substrate including an active region and a non-active region; forming a first gate electrode including a dielectric layer pattern, a first conducting layer pattern, and an insulating layer pattern in the active region of the substrate, the first gate electrode functioning as a flash memory; forming first spacers on sidewalls of the first gate electrode; forming a second gate electrode including a gate oxide pattern and a second conducting layer pattern on the same substrate, the second gate electrode functioning as a normal gate electrode; forming a source/drain region with a shallow junction adjacent to one of the first spacers and the second gate electrode in the substrate by performing a first ion implantation process using the first spacers as a mask; forming second spacers both on the sidewall of the first spacer and the sidewalls of the second gate electrode; and completing a source/drain region with an LDD region by forming a source/drain region with a deep junction adjacent to the first spacer in the substrate, the source/drain region with the deep junction being formed by a second ion implantation process using the second spacers as a mask.

An example semiconductor device disclosed herein comprises a first gate electrode and a second gate electrode formed within a single cell on a substrate, the first gate electrode functioning as a flash memory, the second gate electrode functioning as a normal gate electrode; first spacers formed on the sidewalls of the first gate electrode; second spacers formed both on a sidewall of the first spacer and the sidewalls of the second gate electrode; and a source/drain region with an LDD region formed adjacent to the first spacer and adjacent to the second gate electrode in the substrate.

Although certain example methods and apparatus have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method for fabricating a semiconductor device comprising:

forming a first gate electrode including a dielectric layer, a first conducting layer formed on the dielectric layer, and a first insulating layer formed on the conducting layer on a substrate, the first gate electrode functioning as a flash memory;

forming first spacers on sidewalls of the first gate electrode;

forming a second gate electrode comprising a gate oxide layer and a second conducting layer on the substrate, the second gate electrode functioning as a normal gate electrode;

performing a first ion implantation process using at least one of the first spacers as a mask to form a shallow junction region for a source/drain region;

forming second spacers on a sidewall of the first spacer and on sidewalls of the second gate electrode; and performing a second ion implantation process using at least one of the second spacers as a mask to form a deep junction region for the source/drain region.

2. A method as defined in claim 1, wherein forming the first spacers comprises:

forming a second insulating layer on the substrate and the first gate electrode; and performing an etch back process on the second insulating layer.

3. A method as defined in claim 1, wherein forming the second spacers comprises:

forming a third insulating layer on the substrate, the first gate electrode, the first spacers, and the second gate electrode; and performing an etch back process on the third insulating layer.

* * * * *